United States Patent
Maling et al.

(10) Patent No.: US 9,043,743 B2
(45) Date of Patent: May 26, 2015

(54) AUTOMATED RESIDUAL MATERIAL DETECTION

(71) Applicant: INTERNATIONAL BUSINESS MACHINES CORPORATION, Armonk, NY (US)

(72) Inventors: Jeffrey C. Maling, Grand Isle, VT (US); Anthony K. Stamper, Williston, VT (US); Zeljka Topic-Beganovic, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/060,098

(22) Filed: Oct. 22, 2013

(65) Prior Publication Data

US 2015/0113494 A1   Apr. 23, 2015

(51) Int. Cl.
| | |
|---|---|
| G06F 17/50 | (2006.01) |
| H01L 23/58 | (2006.01) |
| G01R 31/26 | (2014.01) |
| H01L 21/66 | (2006.01) |
| H01L 23/544 | (2006.01) |
| G01N 23/20 | (2006.01) |

(52) U.S. Cl.
CPC .......... *H01L 23/544* (2013.01); *G06F 17/5072* (2013.01); *G01N 23/20091* (2013.01)

(58) Field of Classification Search
CPC ..... G06F 17/5081; H01L 22/00; H01L 22/10; H01L 22/34; G05B 2219/45031
USPC .......... 716/136; 700/121; 438/14, 18; 257/48
See application file for complete search history.

(56) References Cited

U.S. PATENT DOCUMENTS

| | | | |
|---|---|---|---|
| 4,800,282 A | 1/1989 | Nishimura | |
| 5,518,656 A | 5/1996 | Furuta et al. | |
| 6,133,576 A | 10/2000 | Shafer et al. | |
| 6,146,795 A | 11/2000 | Huang et al. | |
| 6,335,531 B1 | 1/2002 | Somerville et al. | |
| 6,369,887 B2 | 4/2002 | Eyolfson et al. | |
| 6,429,928 B2 | 8/2002 | Johnson et al. | |
| 6,831,734 B2 | 12/2004 | Eyolfsou et al. | |
| 7,077,971 B2 | 7/2006 | Ni et al. | |
| 7,179,538 B2 | 2/2007 | Gauthier et al. | |
| 7,179,568 B2 | 2/2007 | Cerrina et al. | |
| 7,197,726 B2 * | 3/2007 | Ciplickas et al. | 716/126 |
| 7,243,316 B2 * | 7/2007 | White et al. | 716/50 |
| 7,254,803 B2 * | 8/2007 | Jeong et al. | 716/53 |
| 7,383,521 B2 * | 6/2008 | Smith et al. | 716/114 |
| 7,423,287 B1 * | 9/2008 | U'Ren et al. | 257/48 |
| 7,785,906 B2 * | 8/2010 | Wu et al. | 438/17 |
| 7,932,727 B2 * | 4/2011 | Bolle et al. | 324/525 |
| 8,673,668 B2 * | 3/2014 | Kronholz et al. | 438/48 |
| 2002/0032888 A1 * | 3/2002 | Ott et al. | 714/724 |
| 2003/0096436 A1 * | 5/2003 | Satya et al. | 438/11 |
| 2005/0221229 A1 * | 10/2005 | Nasser-Ghodsi et al. | 430/296 |
| 2007/0111342 A1 * | 5/2007 | Satya et al. | 438/17 |
| 2008/0163140 A1 * | 7/2008 | Fouquet et al. | 716/4 |
| 2008/0246030 A1 * | 10/2008 | Satya et al. | 257/48 |

(Continued)

*Primary Examiner* — Stacy Whitmore (74) *Attorney, Agent, or Firm* — Anthony Canale; Roberts Mlotkowski Safran & Cole, P.C.

(57) ABSTRACT

Methods, systems, and structures for detecting residual material on semiconductor wafers are provided. A method includes scanning a test structure including topographic features on a surface of a semiconductor wafer. The method further includes determining, based on the scanning, that the test structure includes an amount of a residual material of a sacrificial layer that exceeds a predetermined threshold.

20 Claims, 7 Drawing Sheets

(56) References Cited

U.S. PATENT DOCUMENTS

| | | | |
|---|---|---|---|
| 2008/0265247 A1* | 10/2008 | Feustel et al. | 257/48 |
| 2009/0087938 A1* | 4/2009 | Ramappa et al. | 438/49 |
| 2009/0140246 A1* | 6/2009 | Grillberger et al. | 257/48 |
| 2009/0153174 A1* | 6/2009 | Wu et al. | 324/765 |
| 2009/0160027 A1* | 6/2009 | Park et al. | 257/618 |
| 2009/0243625 A1* | 10/2009 | Bolle et al. | 324/537 |
| 2010/0197114 A1* | 8/2010 | Jeng et al. | 438/460 |
| 2010/0314619 A1* | 12/2010 | Kaltalioglu et al. | 257/48 |
| 2011/0254164 A1* | 10/2011 | Gordon et al. | 257/751 |
| 2011/0277840 A1* | 11/2011 | Bryden et al. | 136/262 |
| 2012/0001174 A1* | 1/2012 | Kronholz et al. | 257/48 |
| 2012/0167028 A1* | 6/2012 | Ferguson et al. | 716/112 |
| 2013/0082257 A1* | 4/2013 | Balasingham et al. | 257/48 |
| 2013/0263074 A1* | 10/2013 | Ferguson | 716/112 |
| 2014/0179123 A1* | 6/2014 | Korczynski et al. | 438/795 |

* cited by examiner

AUTOMATED RESIDUAL MATERIAL DETECTION

FIELD OF INVENTION

The invention relates to the fabrication of integrated circuits and, more particularly, to methods of preventing fabrication defects.

BACKGROUND

The fabrication of an integrated circuit (IC) on a semiconductor wafer involves several processes, including thin film deposition, photoresist application followed by lithographic patterning, etching thin films, and removing or stripping photoresist. For example, an integrated circuit fabrication process may include depositing a blanket film of photoresist (i.e., a photoactive compound) on a wafer, and patterning the photoresist by illuminating it through a patterned mask (i.e., a photomask). The process then develops the photoresist to remove the exposed portions (in the case of a positive photoactive material). Next, the process patterns the wafer by etching, depositing and/or implanting material at the locations at which the photoresist was removed. Afterwards, the unexposed photoresist is removed using, for example, either a plasma, oxygen, or an aqueous solution or solvent to remove the photoresist from the patterned wafer. Defects in the integrated circuit can arise during any of the above process steps. Such defects include incomplete and malformed structures that prevent the integrated circuit from operating as designed.

SUMMARY

In an aspect of the invention there is a method for detecting residual material. The method includes scanning a test structure including topographic features on a surface of a semiconductor wafer. The method further includes determining, based on the scanning, that the test structure includes an amount of a residual material of a sacrificial layer that exceeds a predetermined threshold.

In another aspect of the invention there is a method for detecting residual material on a semiconductor wafer. The method includes identifying a test structure including topographic features based on a minimum feature size of an integrated circuit design or a minimum spacing size of the integrated circuit design. The method also includes modifying the integrated circuit design to include the test structure at a predetermined location of the wafer.

In another aspect of the invention, there is a structure for detecting residual material on a semiconductor wafer. The structure includes an active area on a semiconductor wafer having structures associated with a predefined minimum feature size and a predefined minimum spacing size. The structure further includes a test structure in a dicing channel of the semiconductor wafer that includes topographic features. The topographic features include a first topographic feature having a size that is equal to one of the predefined minimum feature size of and the predefined minimum spacing size, a second topographic feature having a size that is greater than the size of the first topographic feature, and a third topographic feature having a size that is less than the size of the first topographic feature.

In another aspect of the invention, a design structure tangibly embodied in a machine readable storage medium for designing, manufacturing, or testing an integrated circuit is provided. The design structure comprises structures associated with a predefined minimum feature size and a predefined minimum spacing size. In further embodiments, a hardware description language (HDL) design structure encoded on a machine-readable data storage medium comprises elements that when processed in a computer-aided design system generates a machine-executable representation of the integrated circuit chip of the present invention. In still further embodiments, a method in a computer-aided design system is provided for generating a functional design model of the integrated circuit chip of the present invention. The method comprises generating a functional representation of the structural elements of the integrated circuit chip of the present invention.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The invention relates to the fabrication of integrated circuits and, more particularly, to preventing fabrication defects caused by not fully removing photoresist from features on the wafer. According to aspects of the present invention, structures on a surface of a wafer are measured before and/or after a photoresist strip process to detect residual material. In embodiments, the photoresist strip process removes a sacrificial layer (e.g., a photoresist film), and the residual material is a portion of the sacrificial layer (e.g., residual photoresist) that remains after completion of the strip process. For example, during fabrication of a semiconductor wafer using photolithography, a patterned photoresist layer may be removed using a hot strip process. When removed, parts of the photoresist melt from the wafer in different ways depending on their size, location, rate of melting, and rate of strip. Large blanket areas of photoresist tend to melt evenly; however, small and/or narrow pieces of photoresist may pull together into piles (i.e., balls) when melted. Due to their thickness, these piles may not be fully stripped during the strip process and, thus, leave residual photoresist on a wafer. Additionally, when melted, the photoresist piles may move (e.g., via a capillary-like action) and merge with nearby structures. Thus, residual material can remain in locations that create defects in subsequently formed structures. As such, improving detection of residual material has significant business value by avoiding scrap and improving client serviceability.

Elimination of residual material is difficult due to the number of variables involved in strip processing. In addition to the topography of a wafer, different wafers can have different heating characteristics. For example, a hot stripping tool (e.g., using a downstream high density oxygen plasma process) exposes a wafer to varying temperatures since, at the process pressure (e.g., 1.5 torr), heating is primarily conductive and, thus, variable. Heating of a wafer also varies based on wafer backside materials, chuck flatness, wafer flatness, wafer backside particle defects, and chuck particle defects. As such, residual material may not be entirely prevented by process controls.

According to aspects of the invention, an analysis is made to detect residual material, such as residual photoresist. In embodiments, residual material can be detected by performing spectrographic analyses of a wafer (e.g., using Energy-dispersive X-ray spectroscopy (EDX)) to detect constituent elements of residual material (e.g., carbon) in films that otherwise do not contain such elements (e.g., $SiO_2$, $Si_3N_4$, Si, etc.). To improve detection of the elements included in a particular residual material, filters corresponding to the elements in the residual material can be used in the measuring apparatus. Further, wafers can be scanned for elements of the sacrificial layer before and/or after a photoresist strip process. By doing so, the initial measurement can be used as a baseline for comparison with a measurement after a strip process in methods to detect residual material after the strip process.

In accordance with aspects of the invention, test structures are fabricated on surfaces of semiconductor wafers to allow for automated detection of residual material on a production basis. The test structures may include topographic features that are more likely to contain residual material to remain after a strip process than structures of integrated circuit designs to be fabricated on the wafers. In embodiments, the topography of the test structures include features corresponding to the minimum feature size and/or minimum feature spacing of integrated circuit designs (e.g., a minimum feature size design rule). Additionally, in embodiments, the test structures are fabricated in predetermined locations of a wafer, such as in a dicing channel, to facilitate automated scanning of the test structures by defect metrology systems.

In accordance with aspects of the invention, an automated process performs the detection of residual material on a production basis using fabrication defect metrology systems with no operator intervention. For example, a defect metrology system can scan some (e.g., random) wafers or all wafers in a production batch to detect residual material of a sacrificial layer in the test structures. In embodiments, the photoresist detection is performed in situ using a portable measuring apparatus. According to aspects of the invention, when the defect metrology system detects residual material (e.g., photoresist residue) in a feature of the test structure that narrower, wider, or of equal width than a predetermined size (e.g., minimum feature size or minimum feature spacing), the defect metrology system issues an alert and/or identifies the wafers for remedial processing, such as additional strip processing.

Figure 1:
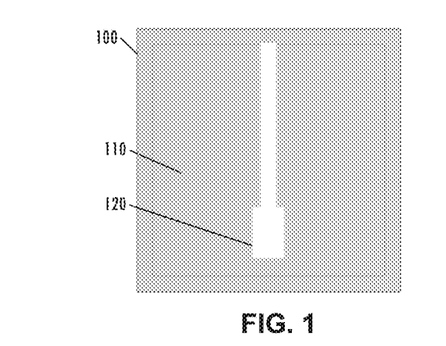
FIG. 1 shows exemplary structures and fabrication steps in accordance with aspects of the present invention.
Figure 2:
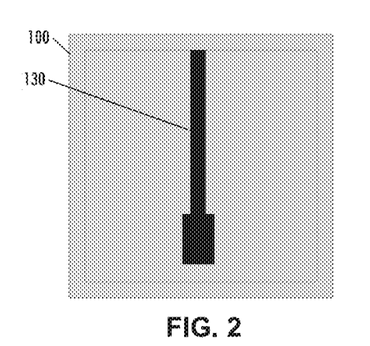
FIG. 2 shows exemplary structures and fabrication steps in accordance with aspects of the present invention.
Figure 3:
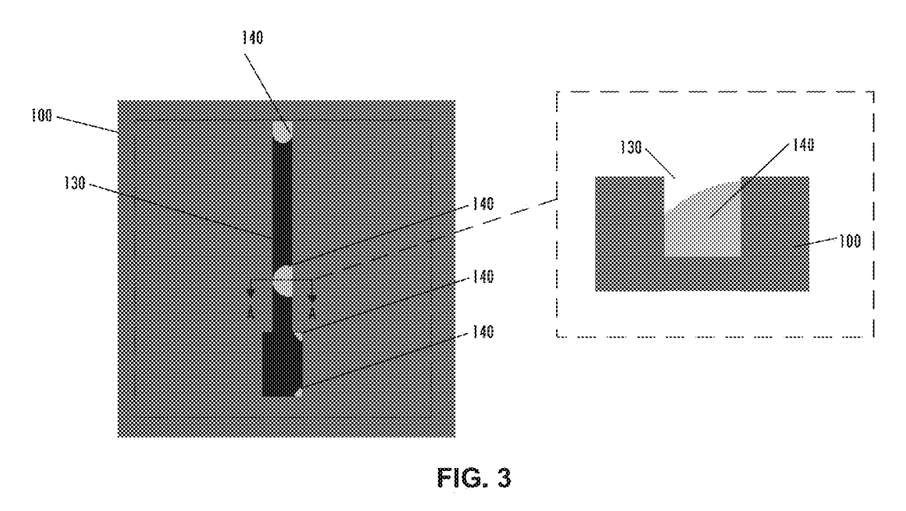
FIG. 3 shows exemplary structures and fabrication steps in accordance with aspects of the present invention.

FIGS. 1-3 show structures and fabrication steps in accordance with aspects of the present invention. FIG. 1 shows a portion of an exemplary wafer 100 after having a surface coated with a sacrificial layer 110, which has been processed to form a pattern 120. In embodiments, sacrificial layer 110 is a photoresist film that has been masked, exposed, and developed to form pattern 120 in unexposed portions of the photoresist film.

FIG. 2 shows wafer 100 after patterning to form a structure 130 using pattern 120. For example, structure 130 is a trench etched into the surface of wafer 100 within pattern 120 of sacrificial layer 110.

FIG. 3 shows wafer 100 having piles of residual material 140 which have formed during a stripping process to remove sacrificial layer 110. For example, where sacrificial layer 110 is a photoresist film, unexposed portions of the photoresist film may be stripped using an aqueous solution or solvent and, after removal, piles of residual photoresist may remain in structure 130 (e.g., a trench).

In FIG. 3, sectional view A-A of wafer 100 shows an expanded view of residual material 140 partially filling a portion of structure 130. For example, where structure 130 is a trench, residual material 140 can fill some or all of a section of the trench and, thus, result in a weak or broken section of a subsequent structure (e.g., an interconnect, wire, etc.) that fills the trench. This can cause a defect in an integrated circuit fabricated on wafer 100 and result in scrapping of the wafer or affecting the integrated circuit. Thus, by detecting and removing residual material 140 before forming other structures (e.g., structure 130), aspects of the present invention avoid such defects and loss of product.

Figure 4:
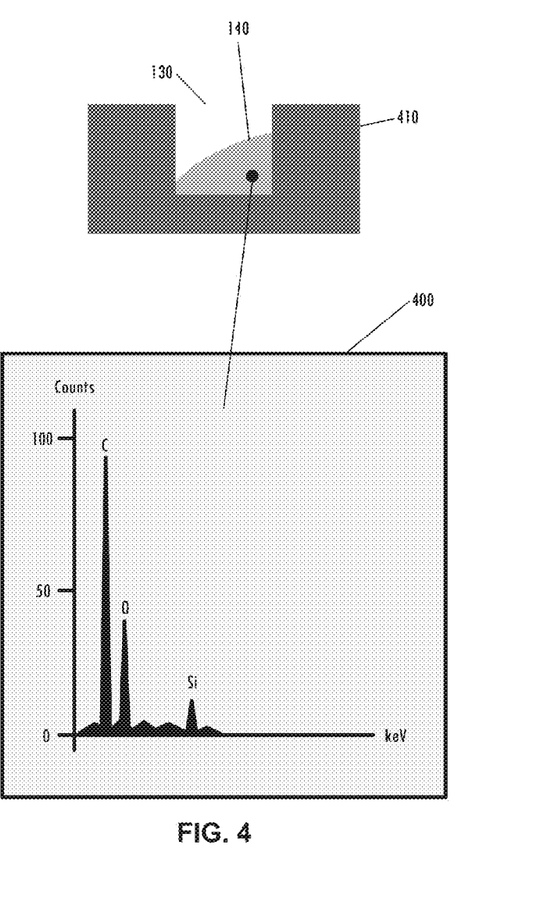
FIG. 4 shows spectrographic analysis of an exemplary semiconductor structure in accordance with aspects of the present invention.
Figure 5:
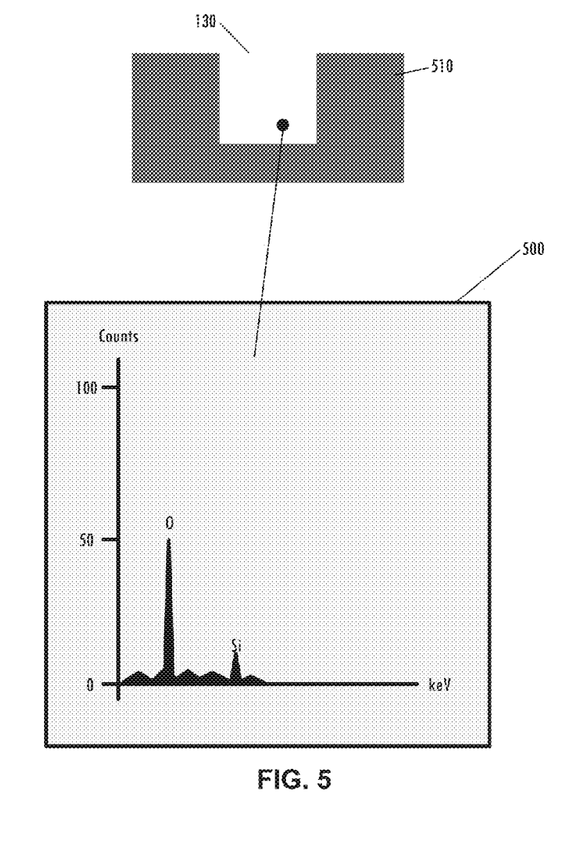
FIG. 5 shows spectrographic analysis of an exemplary semiconductor structure in accordance with aspects of the present invention.

FIGS. 4 and 5 show spectrographic analyses 400 and 500 of exemplary structures (e.g., structure 130) on a wafer (e.g., wafer 100) in accordance with aspects of the present invention. In embodiments, spectrographic analyses 400 and 500 represent emissions detected by Energy Dispersive X-ray spectroscopy (EDX) scans. The x-axis of spectroscopic analyses 400 and 500 correspond to energy levels (e.g., keV) at which periodic table elements (e.g., carbon, oxygen, and silicon) emit electrons when excited. The y-axis of spectrographic analyses 400 and 500 correspond to the quantity (e.g., counts) of the electron emissions. Thus, results of spectrographic analyses 400 and 500 indicate a presence or absence of different elements included in the exemplary test wafer sections 410 and 510, as well as a relative quantity of the elements.

In FIG. 4, spectrographic analysis 400 corresponds to a section of wafer 410 in which residual material 140 formed during a strip process (e.g., sectional view A-A in FIG. 3). For example, wafer 410 (which may be the same or similar to wafer 100) may be formed of silicon dioxide ($SiO_2$) and residual material 140 may be a portion of a sacrificial layer (e.g., sacrificial layer 110) formed of carbon (C) and other elements. Spectrographic analysis 400 of the depicted section of wafer 410 includes three peaks, "C," "O," and "Si," indicating the presence of carbon (C), oxygen (O), and silicon (Si), respectively. Because $SiO_2$ does not include carbon, the carbon peak C indicates the presence of residual material 140. In such case, in accordance with aspects of the invention, an automated defect metrology system (or the like) can identify wafer 410 for remedial processing to remove residual material 140. In embodiments of the invention, the sacrificial layer is a photoresist layer and wafer 410 may be flagged for additional photoresist stripping to remove residual photoresist.

In FIG. 5, spectrographic analysis 500 corresponds to a section of a wafer 510 (which may be the same or similar to the wafer 410) in which no residual material has formed during a strip process. Spectrographic analysis 500 of wafer 510 includes two peaks, "O" and "Si," indicating the presence of oxygen (O) and silicon (Si), but no peak "C" indicating a lack of carbon-based residual material. Thus, the depicted section of wafer 510 does not include a peak corresponding to the constituent material (or materials) of the sacrificial layer (e.g., carbon). Thus, in accordance with aspects of the invention, a defect metrology system (or the like) may not identify wafer 510 for remedial processing. Notably, low levels of carbon or other elemental contamination may occur on wafers due to mechanisms unrelated to leaving residual photoresist in features on the wafer. In the above example, the lack of a peak of an element (i.e., "no peak"), ignores such background contamination levels. However, it is understood that some background contamination may be present. For example, referring to FIGS. 4 and 5, the background level of carbon could produce 5 counts peak height, which is much lower than the ~90 count peak height observed for the wafer with residual photoresist in FIG. 5.

Figure 6:
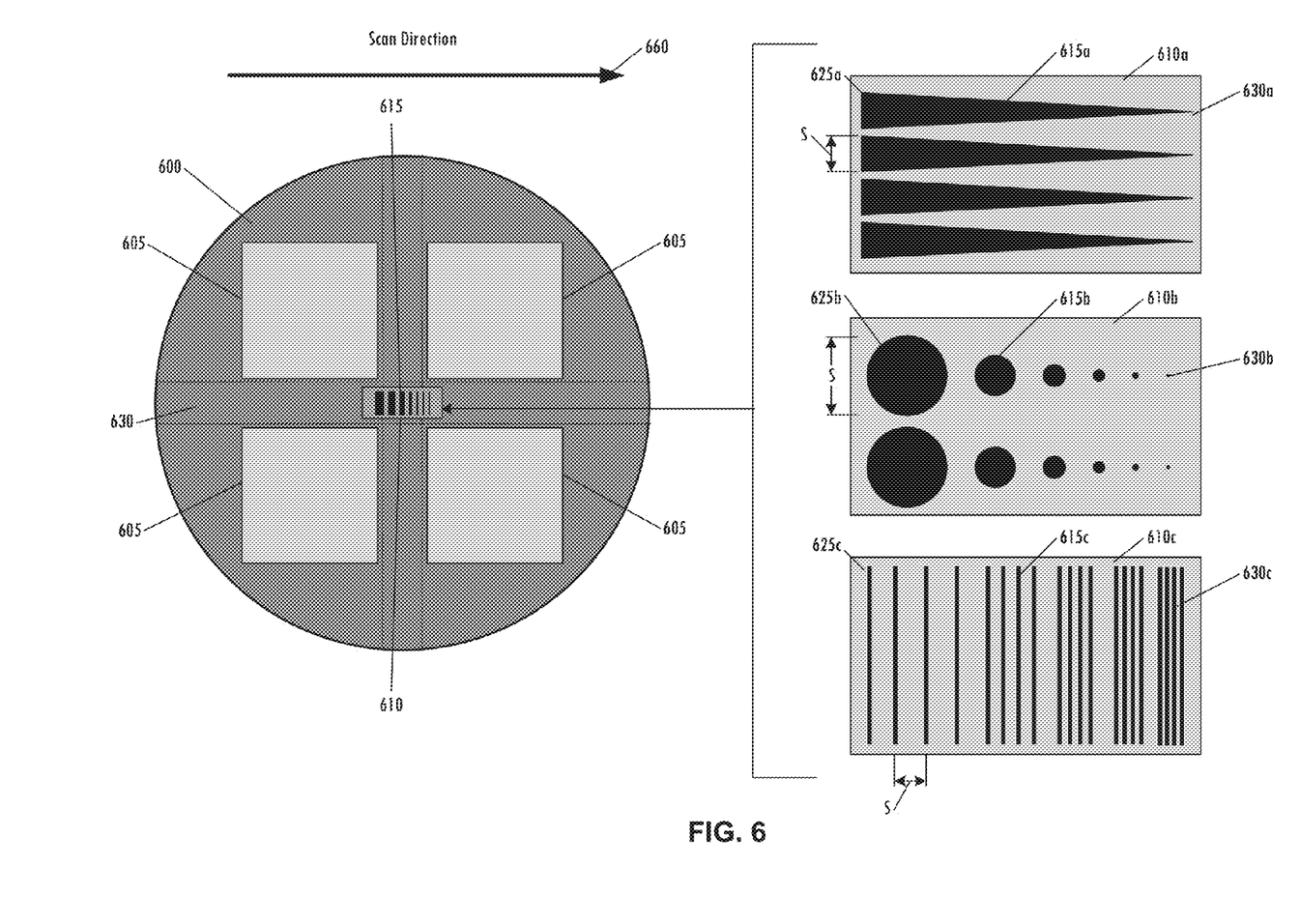
FIG. 6 shows an exemplary semiconductor wafer including a test structure in accordance with aspects of the present invention.

FIG. 6 shows an exemplary wafer 600 including a test structure in accordance with aspects of the present invention. Wafer 600 (which may be the same or similar to wafer 100) includes integrated circuit (IC) structures 605 (e.g., active devices and/or back end of line (BEOL) structures) and test structure 610. In accordance with aspects of the invention, test structure 610 is formed in one or more predefined locations for automated scanning by a defect metrology system. In embodiments, the one or more predefined locations are in a dicing channel or kerf 630 that contains both physical and electrical test structures (e.g., PCM—Process Control Monitor kerf) that separates structures 605 on wafer 600. In embodiments, test structure 610 is sized to fit in standard scribe line width (e.g., between 30 μm and 500 μm).

In accordance with aspects of the invention, an automated defect metrology system locates and scans test structure 610 such that residual material detection is performed without human operator involvement. In embodiments, wafer 600 may be held in a known position on a chuck and the defect metrology system scans dicing channel 630 of wafer 600, which is in a known location in relation to the position of wafer 600, using an EDX apparatus. The scanning can be performed in a direction 660 that is parallel to the features of test structure 610. Further, the beam of the EDX apparatus may have a width that is wider than the spaces between topographic features of the test structure 610.

In accordance with aspects of the invention, test structure 610 includes a number of topographic features 615 that are more likely to cause residual material to remain after a stripping process than integrated circuit structures 605. That is, topographic features 615 have shapes and sizes more prone to form residual material in comparison to the shape and sizes of structures 605. In embodiments, the sizes of topographic features 615 encompass a range of sizes, including some that are smaller than the minimum feature size and/or the minimum feature spacing permitted for structures 605 by fabrication process design rules. For example, topographic features 615 can include repeated, narrow channels of different sizes between features that induce piles of residual material to accumulate. The fabrication design rules may set minimum feature spacing of 1.3 μm for features in structures 605. In such case, the size range of topographic features 615 in test structure 610 can include features that are 10.0 μm, 5.0 μm, or 2.5 μm, which are larger than the minimum feature size of 1.3 μm. Additionally, topographic features 615 can include at least one feature that is equal to the minimum feature size of 1.3 μm. Further, topographic features 615 can include features that are, for example, 0.6 μm, 0.3 μm, which are smaller than the minimum feature size of 1.3 μm. These values are exemplary and the invention in not limited to such values for topographic features 615. In this way, test structure 610 enables detection of residual material at the margins of fabrication process limitations for structures 605.

In accordance with aspects of the invention, test structure 610 is formed from a material that is not susceptible to damage from strip processing reagents. For example, test structure 610 may be comprised of a conductor or dielectric (e.g., $SiO_2$) that is patterned to include topographic features 615. In embodiments, topographic features 615 of test structure 610 are trenches etched into wafer 600. Alternatively, topographic features 615 are three-dimensional shapes (i.e., triangles or cylinders) formed on the surface of wafer 600 by removing portions of a layer of material (e.g., $SiO_2$) formed on wafer 600.

Test structures 610a, 610b, and 610c illustrate embodiments of test structure 610 in accordance with aspects of the invention. Test structure 610a includes an array of topographic features 615 in the form of triangular shapes (e.g., triangles), each having a base 625a and a vertex 630a. In accordance with aspects of the invention, base 625a has a size that is greater than the minimum feature size and/or the minimum spacing size, and vertex 630 has a size that is less than the minimum feature size and/or the minimum spacing size. In embodiments, base 625a may have a size corresponding to an a specific isolated feature within structures 605 (e.g., a feature spaced 5-times to 10-times the minimum spacing from other features in structures 605) and vertex 630a may be sub-minimum feature size or sub-minimum spacing size (formed as point). For example, the minimum feature size set by design rules for a fabrication process may be 1.0 μm. Accordingly, the size S of topographic features 615a range from, for example, 5 μm at base 625a to 0.3 μm at vertex 630a. Based on the different sizes of topographic features 615a, larger portions of residual material may tend form at either bases 625a or vertexes 630a; whereas small portions of residual material would likely concentrate at vertices 630a.

Test structure 610b includes an array of circular topographic features 615b (e.g., cylinders) of various sizes S (i.e., diameters). For example, where the minimum feature size set by design rules for a fabrication process may be 1.0 μm, size S of topographic features 615b may range from, for example, 10 μm at left end 625b to 0.3 μm at right end 630b. Such circular topographic features 615b can be for causing and detecting blobs of residual material, which would likely form in the larger one of circular topographic features 615b toward the left end 625 of test structure 610b. Small portions of residual material would likely concentrate in the smaller ones of circular topographic features 615b at right end of test structure 610b.

Test structure 610c includes topographic features 615c which are arrays of line/space (i.e., linear) structures of varying sizes S of spacing from fully isolated to sub-minimum feature spacing. For example, where minimum feature spacing set by design rules for a fabrication process may be 0.5 μm, spacing S of features 615c may range from, for example, 5 μm at left end 625c to 0.1 μm at right end 630c. In embodiments, features 615c can be more effective for causing and detecting residual material in BEOL structures and the like.

In embodiments, different topographic features 615 and sizes S of test structure 610 are predefined and stored in a design element library. An integrated circuit designer may select test structures 610 having a type and sizes of topographic features 615 corresponding to topography and size of structures of a particular integrated circuit or layer of an integrated circuit. For example, for BEOL structures, an IC designer may select test structure 610c having topographic features 615c that are smaller than the minimum spacing permitted by a design rule for the BEOL structures. Further, while FIG. 6 shows only one test structure 610, wafer 600 may include a number of test structures 610 having the same or different topographic features 615 and sizes S.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
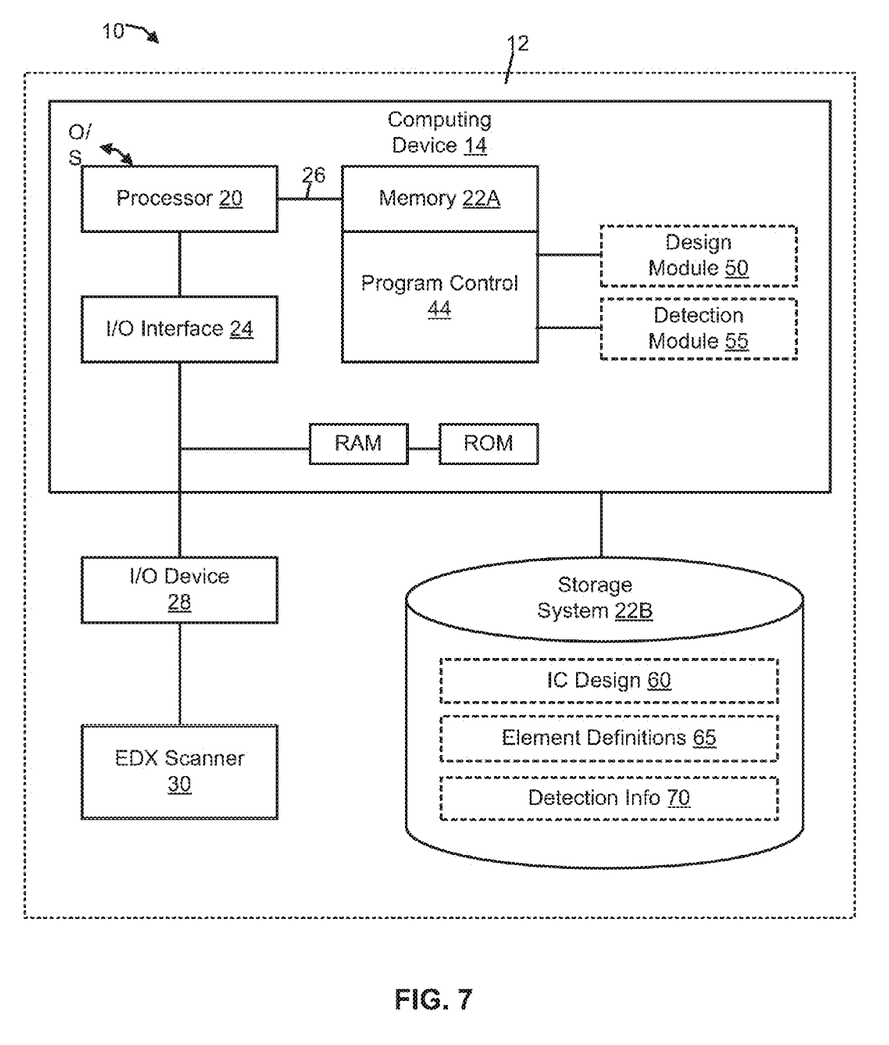
FIG. 7 shows an illustrative environment for implementing designs and steps in accordance with aspects of the invention.

FIG. 7 is an exemplary environment 10 for implementing the steps in accordance with aspects of the invention. To this extent, the environment 10 includes a server or other computing infrastructure 12 that can perform the processes described herein. In particular, the computer infrastructure 12 includes a computing device 14. The computing device 14 can be resident on a network infrastructure or computing device of a third party service provider (any of which is generally represented in FIG. 7). In accordance with aspects of the invention, computing device is an automated defect metrology system.

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc. EDX scanner 30 is an energy-dispersive X-ray spectroscopy device controllable to scan a surface of semiconductor wafers in order to detect constituent elements of materials on the surface. In embodiments, EDX scanner is a portable device that performs in situ scanning of wafers during strip processing.

In general, processor 20 executes computer program code (e.g., program control 44), which can be stored in the memory 22A and/or storage system 22B. Moreover, in accordance with aspects of the invention, program control 44 controls a design module 50 and/or a detection module 55 to perform one or more of the processes described herein. Design module 50 and/or detection module 55 can be implemented as one or more sets of program code in the program control 44 stored in memory 22A as separate or combined modules. Additionally, design module 50 and/or detection module 55 may be implemented as separate dedicated processors or a single or several processors to provide the function of these tools.

While executing the computer program code, the processor 20 can read and/or write data to/from memory 22A, storage system 22B, and/or I/O interface 24. The program code executes the processes of the invention, for example, design module 50 and the detection module 55. Further, data read and/or write data to/from the memory 22A, storage system 22B and/or I/O interface 24 may include an IC design 60, element definition 65 and detection information 70. Bus 26 provides a communication link between each of the components in computing device 14.

In accordance with aspects of the invention, design module 50 is computer program code stored in, for example, memory 22A and/or storage system 22B that, when executed by the processor 20, causes computing device 14 to determine and/or modify IC design 60. Design module 50 may include one or more software or hardware modules for designing, modeling and verifying IC designs using a hardware description language, such as VERILOG or VHDL. For instance, the design module 50 may be a synthesis/placement CAD tool that reads in design definitions (e.g., VHDL), physical area constraints, timing constraints, power constraints, design library information, synthesis rules, and operating conditions. Using these various parameters, design module 50 may determine a layout for elements in an IC design. The determined layout and associated information may be stored by computing device 14 in storage system 22B as IC design 60. Information in the layout may be referenced by detection module 55 to determine a location of test structures (e.g., test structure 610) on a wafer and scan the test structures to detect residual material.

The design module 50 may determine IC design 60 based on element definitions 65 stored in storage system 22B (and/or memory 22A). In accordance with aspects of the invention, element definitions 65 contain definitions of test structures (e.g., test structures 610a, 610b, and 610C), including different topographic feature types (e.g., triangular, circular, linear, etc.) and sizes. In embodiments, an integrated circuit designer may use design module 50 to select one or more test structures and place them within a layout of IC design 60 (e.g., in dicing channel 630).

In accordance with aspects of the invention, detection module 55 is computer program code stored in, for example, memory 22A and/or storage system 22B that, when executed by the processor 20, causes the computing device 14 to function as an automated defect metrology system that detects residual material on the surface of a semiconductor wafer using EDX scanner 30. In embodiments, detection module 55 determines the location of a test structure (e.g., test structure 610) on a wafer (e.g., wafer 600) and controls EDX scanner 30 to scan the test structure to detect residual materials. For example, the test structures can be located at one or more predetermined locations on a wafer (e.g., in dicing channel 630), as defined in IC design 60. Such information may also be included in detection information 70. Based on the predetermined location, detection module 55 can control EDX scanner 30 to scan in a direction (e.g., scan direction 660) to detect residual material (e.g., periodic table elements that are constituents of a sacrificial layer but not constituents of the wafer). Further, based on the output of the EDX scanner 30 (e.g., spectrographic analysis 400 and 500), detection module 55 determines whether an amount and/or a physical location of residual material exceeds a predetermined threshold. In the event the amount of residual material exceeds the predetermined threshold, detection module 55 issues an alert and/or records such information as detection information 70 identifying the wafer for remedial processing (e.g., restrip processing of photoresist material).

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, the computing infrastructure 12 comprises two or more computing devices (e.g., a server cluster) that communicate over any type of communications link, such as a network, a shared memory, or the like, to perform the process described herein. Further, while performing the processes described herein, one or more computing devices on computing infrastructure 12 can communicate with one or more other computing devices external to computing infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 8:
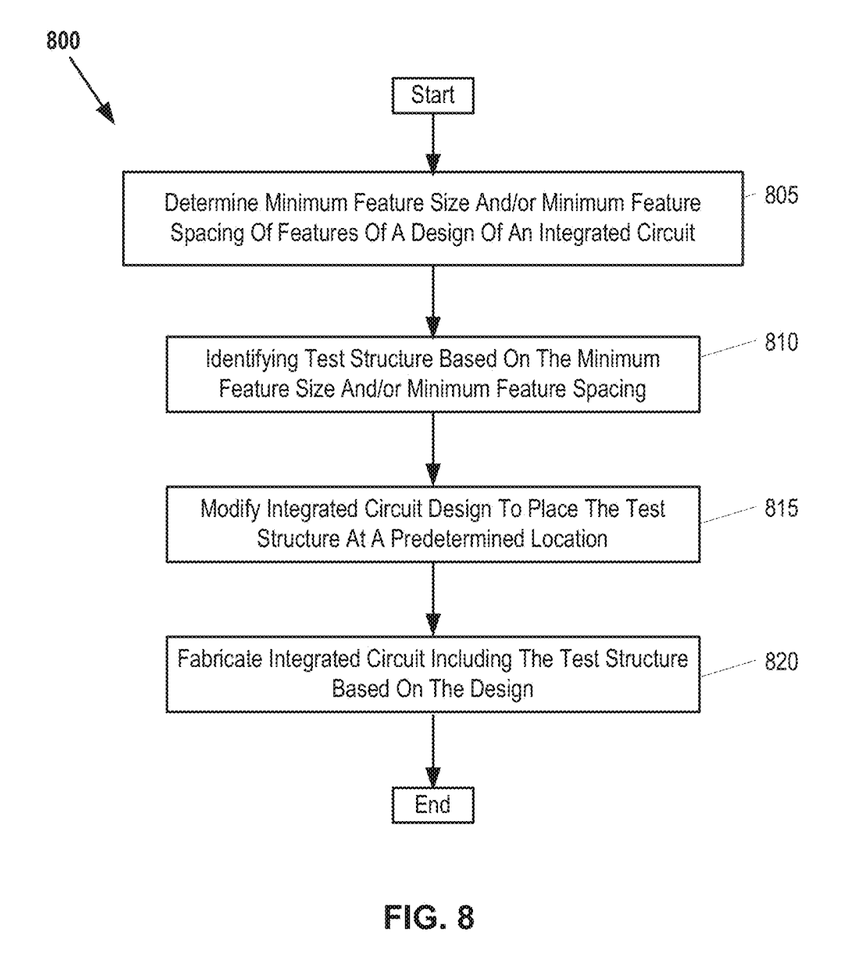
FIG. 8 shows a flow diagram of an exemplary process for fabricating test structures in accordance with aspects of the present invention.
Figure 9:
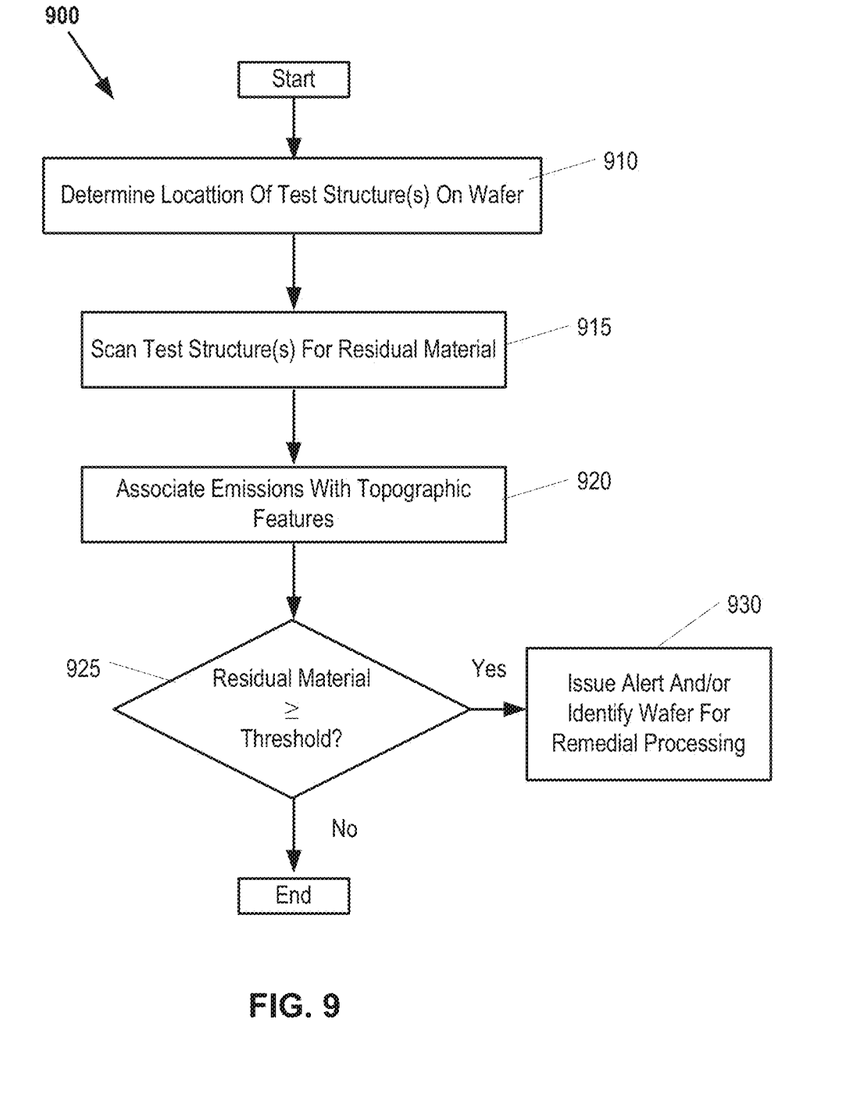
FIG. 9 shows a flow diagram of an exemplary system flow for detecting residual material in test structures on a semiconductor wafer in accordance with aspects of the invention.

FIGS. 8 and 9 show exemplary flows for performing aspects of the present invention. The steps of FIGS. 8 and 9 may be implemented in the wafers of FIGS. 1-6.

The flowcharts in FIGS. 8 and 9 illustrate the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 8 depicts an exemplary process flow 800 for fabricating test structures in accordance with aspects of the invention. At step 805, an integrated circuit designer or design tool (e.g., computing device 14 executing design module 50) determines minimum feature size and/or minimum feature spacing included in a design of semiconductor structures (e.g., structure 605) of an integrated circuit to be built on a wafer (e.g., wafer 600). In embodiments, the minimum feature size and/or minimum feature spacing are predetermined values stored in design rules for the structures or fabrication process (e.g., in IC design 60).

At step 810, the designer or design tool identifies a test structure (e.g., test structure 610) including at least one feature having a size that is less than the minimum feature size and/or minimum feature spacing of the structures determined in step 805. For example, a test structure (e.g., one or test structure 610a, 610b, and 610c) can be selected from a predetermined library of test structures (e.g., element definitions 65) based on a determination that it includes at least one topographic feature (e.g., topographic features 615) that is smaller than the minimum feature size or minimum feature spacing. Additionally, the selected test structure can have a topography determined to be similar to the topography of the structures of the design (e.g., topographic features 630c corresponding to BEOL structures). At step 815, the designer or design tool modifies the design to place the test structures selected in step 810 at predetermined locations. For example, the predetermined location may be a dicing channel (e.g., dicing channel 630) of a wafer.

At step 820, the structures of the integrated circuit are fabricated on the wafer according to the design modified in step 815, along with the test structure identified in step 810 (see, e.g., FIG. 6). As described in greater detail below, an automated fabrication defect metrology system including an EDX tool (e.g., EDX scanner 30) can automatically scan the predetermined locations before and/or after a strip process to determine whether residual material (e.g., a residual photoresist of a photoresist layer) is present in the test structure.

FIG. 9 depicts an exemplary process flow 900 for detecting residual material in test structures on a semiconductor wafer in accordance with aspects of the invention. At step 910, a fabrication defect metrology system (e.g., computing device 14 executing detection module 55) determines the location of a test structure (e.g., test structure 610) on wafer (e.g., wafer 600). In embodiments, the location of the test structure is a predefined location (e.g., stored in IC design 60 and or detection information 70) in a dicing channel (e.g., dicing channel 630).

At step 915, the fabrication defect metrology system scans the location of the test structure using an EDX tool (e.g., EDX scanner 30). In embodiments, the detection software may control the EDX tool to scan the test structure in a predetermined direction (e.g., scanning direction 660) that is parallel to the orientation of test features (e.g., test features 615). For example, the fabrication defect metrology system may move a beam of the EDX tool stepwise over the dicing channel and measure the resulting emissions. Each step may correspond to one or more predefined locations on the wafer (e.g., in Cartesian coordinates).

At step 920, the fabrication defect metrology system associates emissions measured during the scan with locations of topographic features (e.g., topographic features 915) in the test structure. In embodiments, the fabrication defect metrology system associates locations of topographic features (e.g., topographic features 615) with the emissions measured by the EDX tool at those locations. For example, the locations may correspond to sections of the test structure (similar to sections of wafer 410 and 510) and the emissions measured by the EDX tool may correspond to respective spectrographic analyses (e.g. spectrographic analyses 400 and 500).

At step 925, the fabrication defect metrology system determines whether any residual material detected at step 925 is greater than or equal to a predetermined threshold. In embodiments, the threshold is an amount of residual material constituents detected by spectrographic analysis, such as shown in FIGS. 4 and 5. For example, the residual material may include carbon. If the amount of carbon detected by the EDX tool is greater than or equal to a predetermined amount (e.g., 50 counts), then the EDX tool indicates the threshold has been met. The threshold can also be a relative amount of residual material constituent measured before and after a stripping process is performed. For example, the detection software may determine the amount of residual material detected after removal of a sacrificial layer is greater or equal to a predetermined percentage (e.g., 10%) of the peaks measured before removal of the sacrificial layer. Further, the threshold can be a physical location of residual material in a test structure (e.g., test structure 610). For example, in accordance with aspects of the invention, the test structure includes a number of topographic features (e.g., 615a, 615b, and 615c) of different sizes larger than, equal to, and smaller than a minimum feature size and/or minimum feature spacing (e.g., test structures 610a, 610b, and 610c). The threshold may be detection of residual material in one or more topographic features having a size greater than or equal to the minimum feature size (e.g., ≥1.0 µm) or a spacing greater than or equal to the minimum feature spacing (e.g., ≥0.5 µm).

In the event that the fabrication defect metrology system determines that residual material of the sacrificial layer is greater than or equal to the predetermined threshold, then at step 930 the detection software issues an alert and/or identifies the wafer as requiring remedial processing (e.g., additional strip processing) to remove the residual material. The alert may be, for example, an audible or visual indicator, or a message. Identifying the wafer for remedial processing may include, for example, recording such information in detection information.

Figure 10:
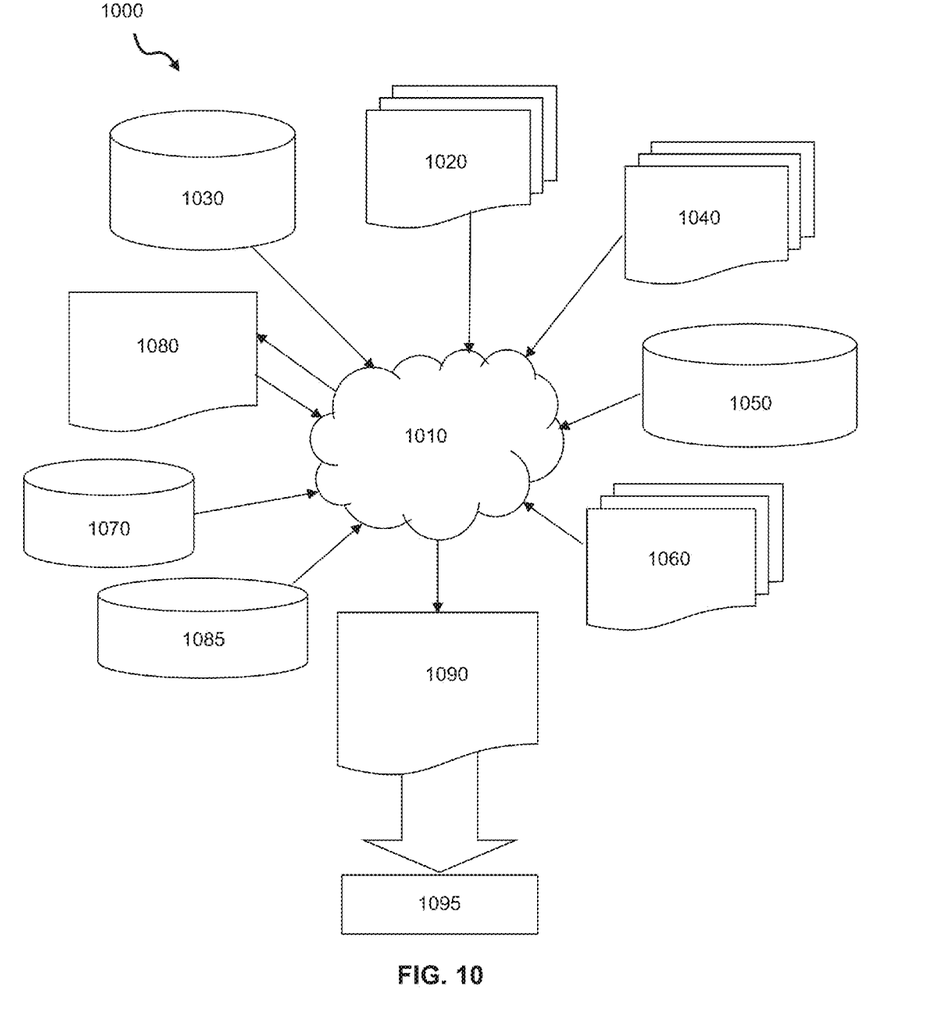
FIG. 10 shows a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIGS. 1-6. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-6. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1-6 to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090.

Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 1090 may comprise a compiled, executable HDL simulation model that functionally simulates the devices shown in FIGS. 1-6.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 1090 may then proceed to a stage 1095 where, for example, design structure 1090: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for detecting residual material, comprising:
   scanning a test structure including a plurality of topographic features on a surface of a semiconductor wafer; and
   determining, based on the scanning, that the test structure includes an amount of a residual material of a sacrificial layer that exceeds a predetermined threshold,
   wherein the scanning comprises: scanning the test structure prior to performing any stripping process to remove the sacrificial layer; and scanning the test structure after the stripping process.

2. The method of claim 1, further comprising identifying, based on the determining, the wafer for remedial processing.

3. The method of claim 1, wherein the scanning comprises scanning the test structure using an automated defect metrology system having an energy-dispersive X-ray spectroscopy scanner.

4. The method of claim 3, wherein the scanning comprises detecting one or more constituent elements of the sacrificial layer included in one or more of the plurality of topographic features based on a spectrographic analysis by the energy-dispersive X-ray spectroscopy scanner.

5. The method of claim 1, wherein:
   the predetermined threshold is a size of a first topographic feature of the plurality of topographic features; and
   the determining the test structure includes the amount of the residual material that exceeds the predetermined threshold comprises detecting residual material in the first topographic feature or another of the plurality of topographic features having a size that is greater than the size of the first topographic feature.

6. The method of claim 5, wherein the size of the first topographic feature is a predefined design rule minimum size for integrated circuit structures formed on the wafer.

7. The method of claim 1, further comprising forming the plurality of topographic features as a triangular shape, wherein:
   a base of the triangular shape is larger than a predefined design rule minimum size for integrated circuit structures formed on the wafer; and
   a vertex of the triangular shape is smaller than the predefined design rule minimum size.

8. The method of claim 1, further comprising forming the plurality of topographic features as an array of circular shapes, wherein:
   a first circular shape of the array of circular shapes has a size that is greater than a predefined design rule minimum size for integrated circuit structures formed on the wafer; and
   a second circular shape of the array of circular shapes has a size that is less than the predefined design rule minimum size.

9. The method of claim 1, further comprising forming the plurality of topographic features as an array of linear shapes, wherein:
   a first linear shape of the array of linear shapes has a size that is greater than a predefined design rule minimum size for integrated circuit structures formed on the wafer; and
   a second linear shape of the array linear shapes has a size that is less than the predefined design rule minimum size.

10. The method of claim 1, further comprising determining a location of the test structure on the wafer.

11. The method of claim 10, wherein the location is a predefined location in a dicing channel of the wafer.

12. The method of claim 1, wherein:
    the sacrificial layer comprises a photoresist material;
    the plurality of topographic features comprises an array of circular trenches that are filled with the sacrificial layer of the photoresist material prior to the stripping process;
    the residual material results from the stripping process that removes the sacrificial layer of the photoresist material; and
    the array of circular trenches includes respective individual circular trenches having different diameters ranging from a largest diameter to a smallest diameter along a scan direction of the scanning,
    and further comprising issuing an alert and identifying the wafer as requiring remedial processing to remove the residual material based on the determining that the test structure includes an amount of the residual material that exceeds the predetermined threshold.

13. A method for detecting residual material on a semiconductor wafer comprising:
    identifying a test structure including a plurality of topographic features based on a minimum feature size of an integrated circuit design or a minimum spacing size of the integrated circuit design, wherein the plurality of topographic features includes grooves or trenches configured to be filled with a sacrificial layer of photoresist material, the residual material resulting from a stripping process that removes the sacrificial layer;
    modifying the integrated circuit design to include the test structure at a predetermined location of the wafer; and
    detecting the residual material at the test structure by scanning the test structure after the stripping process,
    wherein the identifying and the modifying are performed by a design module of a computing device.

14. The method of claim 13, wherein the plurality of topographic features include:
    a first topographic feature that is the minimum feature size or the minimum spacing size;
    at least one second topographic feature having a size that is greater than a size of the first topographic feature; and
    at least one third topographic feature having a size that is less than the size of the first topographic feature.

15. The method of claim 13, wherein the identifying the test structure comprises selecting one of a plurality of predefined test structures stored in a library.

16. The method of claim 15, the selecting comprises selecting one of a plurality of the predefined test structures having a triangular shape based on devices in the integrated circuit design.

17. The method of claim 15, the selecting comprises selecting one of a plurality of the predefined test structures comprising an array of circular shapes based on devices in the integrated circuit design.

18. The method of claim 13, the selecting comprises selecting one of a plurality of the predefined test structures comprising an array of linear shapes based on back end of line included the integrated circuit design.

19. The method of claim 13, wherein the modifying the integrated circuit design to include the test structure at the predetermined location of the wafer comprises placing the test structure in a dicing channel of the wafer.

20. A structure for detecting residual material on a semiconductor wafer, comprising:
    at least one active area on a semiconductor wafer having structures associated with a predefined minimum feature size and a predefined minimum spacing size; and
    a test structure in a dicing channel of the semiconductor wafer including a plurality of topographic features configured to be filled with a sacrificial layer of photoresist material, the residual material resulting from a stripping process that removes the sacrificial layer, wherein the plurality of topographic features include:
a first groove or trench having a size that is equal to one of the predefined minimum feature size and the predefined minimum spacing size;
at least one second groove or trench having a size that is greater than the size of the first groove or trench; and
at least one third groove or trench having a size that is less than the size of the first groove or trench.

* * * * *